United States Patent [19]

Mizumura et al.

[11] Patent Number: 4,609,883
[45] Date of Patent: Sep. 2, 1986

[54] MICROWAVE OSCILLATOR HERMETICALLY SEALED AND COUPLED TO DIELECTRIC RESONATOR

[75] Inventors: Motoo Mizumura; Kenzo Wada, both of Tokyo, Japan

[73] Assignee: NEC Corporation, Tokyo, Japan

[21] Appl. No.: 644,286

[22] Filed: Aug. 27, 1984

[30] Foreign Application Priority Data

Aug. 30, 1983 [JP] Japan ................... 58-158414

[51] Int. Cl.$^4$ ................ H03B 5/18; H03B 7/14
[52] U.S. Cl. .............. 331/96; 331/107 DP; 331/117 D
[58] Field of Search ........... 331/68, 96, 107 DP, 331/107 SL, 117 D; 333/232

[56] References Cited

U.S. PATENT DOCUMENTS 4,511,860  5/1985  Bastida et al. ............... 331/96

OTHER PUBLICATIONS

Jacob et al, "Broad Band Tunable GaAs-FET Oscillator With Hybrid-Coupled Evancent and Microstrip Resonators", *Conference: Proceedings of the 10th European Microwave Conference*, Warsaw, Poland, (Sep. 8–12, 1980), pp. 709–713.

*Primary Examiner*—Eugene R. LaRoche
*Assistant Examiner*—D. C. Mis
*Attorney, Agent, or Firm*—Sughrue, Mion, Zinn, Macpeak & Seas

[57] ABSTRACT

The interior of a metal housing is divided by a dielectric substrate into two compartments. At least one of the compartments is kept air-tight. The substrate carries thereon a semiconductor active element chip for oscillation within the air-tight compartment and a dielectric resonator within the other compartment. The chip and the resonator, electromagnetically coupled with the chip, constitute a microwave oscillator whose oscillation frequency can be stabilized. A metal screw is threaded into that wall of the housing which defines the other compartment in a predetermined positional relationship to the resonator. The metal screw is rotatable to vary the distance between the screw and the resonator and, thereby, the oscillation frequency.

8 Claims, 8 Drawing Figures

MICROWAVE OSCILLATOR HERMETICALLY SEALED AND COUPLED TO DIELECTRIC RESONATOR

BACKGROUND OF THE INVENTION

The present invention relates to a microwave oscillator and, more particularly, to a dielectric-controlled integrated oscillator which is furnished with a semiconductor active element chip and stabilized in oscillation frequency by a dielectric resonator.

In a dielectric-controlled integrated oscillator of the type described, it is a usual practice to mount a substrate made of a material having a high dielectric constant on a button wall inside a metal chassis of a housing, and a semiconductor active element chip and a dielectric resonator on the substrate, the active element chip and dielectric resonator being electromagnetically coupled to each other. The top of the housing is closed by a cover plate to complete a single oscillator package. Generally, the semiconductor active element chip in use has to be protected from the atmospheric air (particularly moisture) by hermetically sealing the oscillator package. Such is usually implemented by soldering or otherwise sealingly connecting the metal chassis to the cover plate after the installation of the substrate, active element chip and the like in the chassis.

The problem encountered with the above-described type of prior art oscillator is that when the oscillator in the sealed package has undergone a change in oscillation frequency due to aging, particularly temperature variation or the like, it is practically impossible to adjust the oscillation frequency. Additionally, it is difficult, if not possible, to set up a desired frequency while absorbing frequency deviation due to dimensional tolerance of the oscillator before the sealed confinement.

As discussed above, the prior art dielectric-controlled type integrated oscillator has failed to reconcile two major requirements to each other, i.e. hermetic or air-tight sealing and frequency adjustment.

SUMMARY OF THE INVENTION

It is therefore an object of the present invention to provide a dielectric-controlled integrated oscillator which is equipped with a semiconductor active element chip and stabilized in oscillation frequency by a dielectric resonator.

It is another object of the present invention to provide a dielectric-controlled integrated oscillator in which a semiconductor active element chip is hermetically confined in an oscillator package to improve the reliability of operation.

It is another object of the present invention to provide a dielectric-controlled integrated oscillator which allows its oscillation frequency to be adjusted with ease and accuracy not only before the hermetic confinement of the semiconductor chip in the oscillator package but also after the hermetic confinement.

It is another object of the present invention to provide a generally improved microwave oscillator.

A microwave oscillator of the present invention is of the type using a semiconductor active element chip for oscillation and a dielectric resonator electromagnetically coupled with the semiconductor active element chip in order to stabilize oscillation frequency. The microwave oscillator comprises a housing having an internal space defined by a plurality of walls. A dielectric substrate is mounted to predetermined ones of the walls of the housing to divide the internal space of the housing into two compartments. The dielectric substrate cooperates with the walls of the housing to define one of the compartments and hold this one compartment air-tight. The semiconductor active element chip is mounted on the dielectric substrate within the one compartment while the dielectric resonator is mounted on the dielectric substrate within the other compartment. Oscillation frequency adjusting means is arranged in the housing in a predetermined positional relationship to the dielectric resonator for adjusting the oscillation frequency.

In accordance with the present invention, the interior of a metal housing is divided by a dielectric substrate into two compartments. At least one of the compartments is kept air-tight. The substrate carries thereon a semiconductor active element chip for oscillation within the air-tight compartment and a dielectric resonator within the other compartment. The chip and the resonator, electromagnetically coupled with the chip, constitute a microwave oscillator whose oscillation frequency can be stabilized. A metal screw is threaded into that wall of the housing which defines the other compartment in a predetermined positional relationship to the resonator. The metal screw is rotatable to vary the distance between the screw and the resonator and, thereby, the oscillation frequency.

The above and other objects, features and advantages of the present invention will become apparent from the following detailed description taken with the accompanying drawings.

DESCRIPTION OF THE PREFERRED EMBODIMENTS

While the microwave oscillator of the present invention is susceptible of numerous physical embodiments, depending upon the environment and requirements of use, substantial numbers of the herein shown and described embodiments have been made, tested and used, and all have performed in an eminently satisfactory manner.

Figure 1A:
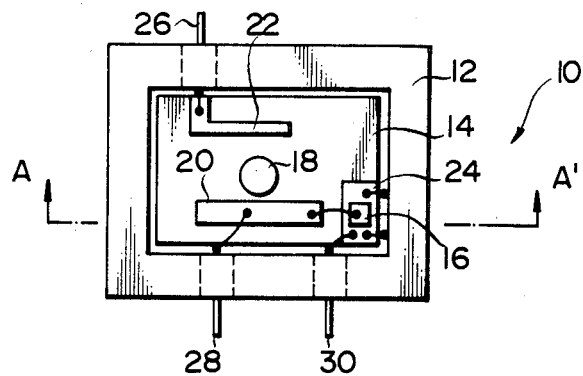
FIG. 1A is a plan view of an internal structure of a prior art dielectric-controlled integrated oscillator viewed from above.
Figure 1B:
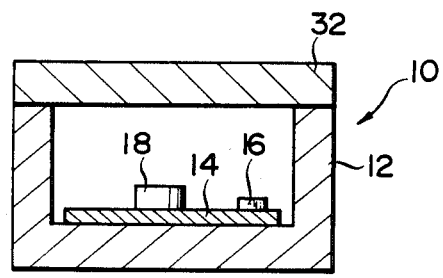
FIG. 1B is a section along line A-A' of FIG. 1A and viewed in a direction indicated by an arrow.

To facilitate understanding of the present invention, a brief reference will be made to prior art oscillators of the type concerned, shown in FIGS. 1A and 1B and FIG. 2. FIG. 1 is a plan view of an internal arrangement of a prior art oscillator 10 viewed from above, while FIG. 1B is a section along line A-A' of FIG. 1A. The oscillator 10 includes a metal chassis 12 and a substrate 14 mounted on a bottom wall of the chassis 12. The substrate 14 is made of alumina ceramic or like material having a high dielectric constant. Carried on the substrate 14 are a semiconductor active element chip 16, a dielectric resonator 18, a pattern 20 for electromagnetically coupling the chip 16 and resonator 18, a pattern 22 for leading out an output, and a pattern 24 for blazing the chip 16. A terminal 26 for picking up an oscillator output and terminals 28 and 30 for applying DC bias to the chp 16 extend out from the metal chassis 12. The top of the metal chassis 12 is closed by a metal cover plate 32 as shown in FIG. 1B.

In the prior art oscillator construction described above, the semiconductor active element chip, 16 comprises a GaAs FET chip a gate electrode of which is connected to the pattern 20 and a drain electrode, to ground. To protect the chip 16 from the atmospheric air, the chassis 12 and cover plate 32 are sealingly connected together as by soldering.

As previously described, the oscillation frequency of such a prior art oscillator cannot be adjusted when it fluctuates after the oscillator per se is hermetically sealed. Also, a difficulty is experienced in setting up a necessary frequency before the hermetic sealing operation. In light of this, frequency adjustment may be implemented by, as shown in FIG. 2, forming a tapped through hole 34 in the cover plate 32 and fitting a metal screw 36 for frequency adjustment in the tapped hole 34. However, the tapped hole 34 in the cover plate 32 inevitably effects the sealed oscillator configuration to allow the semiconductor active element chip 16 to contact the atmospheric air, resulting in a significant decrease in the reliability of operation.

A preferred embdiment of the present invention which is free from the drawbacks inherent in the prior art oscillators will be described in detail with reference to FIGS. 3–6. In the illustrative embodiment, the same or similar structural elements as those shown in FIGS. 1A, 1B and 2 are designated by like reference numerals.

Figure 2:
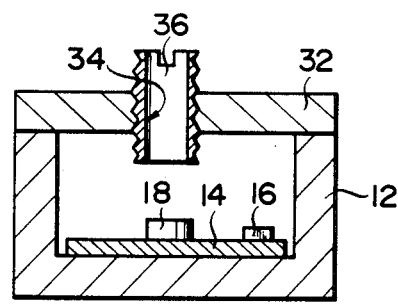
FIG. 2 is a fragmentary sectional side elevation of a modification to the prior art oscillator shown in FIGS. 1A and 1B.

In FIGS. 3–6, the dielectric-controlled integrated oscillator of the present invention, generally 40, comprises a metal chassis 42 which is formed by removing the bottom of the prior art metal chassis 12 shown in FIGS. 1B and 2. The open bottom of the metal chassis 42 is closed by a cover plate, or bottom cover, 44. A metal screw 46 is threaded into the bottom cover 44 for the adjustment of oscillation frequency. In this particular embodiment, the oscillator comprises a three-terminal element such as a Si bipolar transistor or a GaAs FET by way of example. A semiconductor active element chip 16 has a base electrode or a gate electrode connected to a pattern 20 on a dielectric substrate 14 by a bonding wire. A DC bias is applied from outside to the semiconductor active element chip 16 via terminals 28 and 30.

The specific part of the oscillator where the chip 16 is located is hermetically sealed by the chassis 42, cover plate 32, and substrate 14. Meanwhile, a dielectric resonator 18 adapted to determine an oscillation frequency is mounted on the substrate 14 in a space, or compartment, opposite to the space, or compartment, which has the chip 16 thereinside and is hermetically closed as described. The dielectric resonator 18 is electromagnetically coupled with the pattern 20 by way of the substrate 14 to form an oscillation circuit. The oscillation output is picked up at a terminal 26 due to electromagnetic coupling between the resonator 18 and the pattern 22. Further the chassis 42 is hermetically closed at one end by the cover plate 32 to have a generally box-like configuration. a continuous shoulder 42a protrudes from the inner walls of the box 42 while the substrate 14 is hermetically fixed to the shoulder 42a along the periphery thereof, thereby defining an air-tight compartment 48 in cooperation with the cover plate 32.

The semiconductor active element chip 16 is mounted on the substrate 14 within the air-tight compartment 48. The dielectric resonator 18 is mounted on the opposite side of the substrate 14 to the chip 16 so as to be electromagnetically coupled with the chip 16 via the pattern 20. The metal screw 46 is engaged in a threaded hole formed in the bottom cover 44 and manipulatable from the outside such that its tip moves toward and away from the resonator 18 in alignment therewith, thereby allowing the oscillation frequency to be adjusted. In the construction shown and described, the chip 16 is fully isolated from the atmospheric air to insure reliable operation while, at the same time, the metal screw 46 makes the oscillation frequency freely adjustable from the outside.

Figure 3:
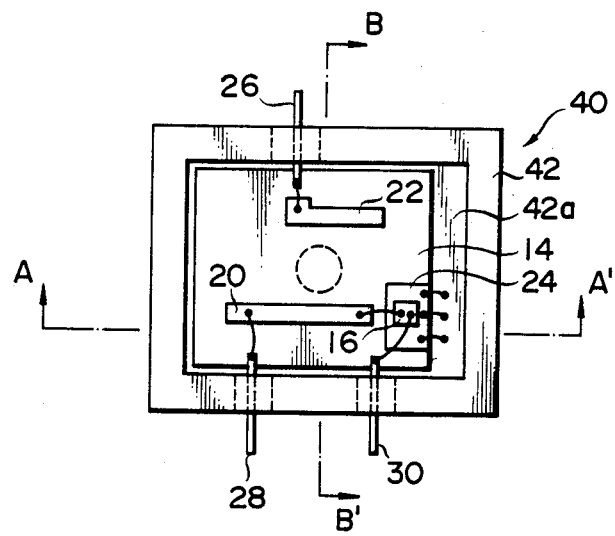
FIG. 3 is a plan view of an internal structure of a dielectric-controlled integrated oscillator embodying the present invention viewed from above.
Figure 4:
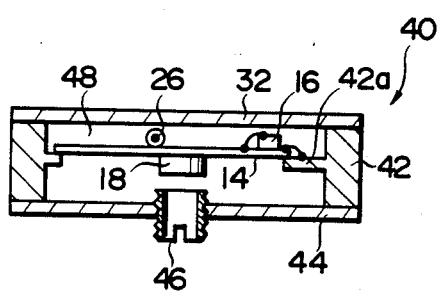
FIG. 4 is a sectional side elevation along line A-A' of FIG. 3 and viewed in a direction indicted by an arrow.
Figure 5:
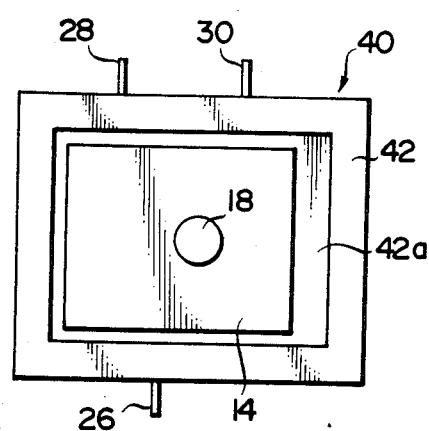
FIG. 5 is a bottom view showing the back of a substrate having a high dielectric constant which is included in the oscillator of FIGS. 3 and 4.
Figure 6:
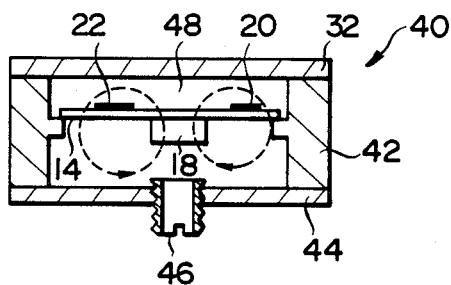
FIG. 6 is a sectional side elevation along line B-B' of FIG. 3 and viewed in a direction indicated by an arrow.

As best shown in FIG. 6, while is a section along line B-B' of FIG. 3, the patterns 20 and 22 on the substrate 14 are electromagnetically coupled with the dielectric resonator 18 by means of suspended strip lines. However, such is only illustrative and any other suitable magnetic coupling means may be used between the patterns 20 and 22 and the dielectroc resonator 18.

Figure 7:
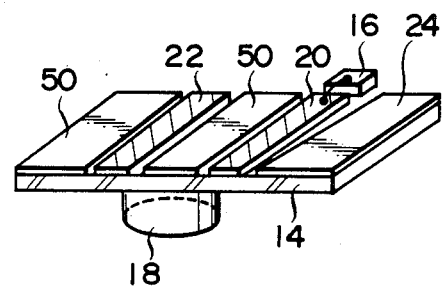
FIG. 7 is a perspective view of a modification to the oscillator shown in FIGS. 3-6.

Referring to FIG. 7, a modification to the oscillator shown in FIGS. 3–6 is shown. In the modified oscillator, coplanar strip lines are employed for electromagnetically coupling the patterns 20 and 22 in the air-tight compartment to the dielectric resonator 18 by way of the substrate 14. The reference numeral 50 in FIG. 7 designates a conductor connecting to ground.

In the embodiment and modification described above, it should be born in mind that the bottom cover 44 is directed to preventing the unloaded Q of the resonator 18 from being lowered by radiation loss. Hence, furnishing the bottom cover 44 with a sealing structure is needless.

In summary, it will be seen that the present invention provides a microwave oscillator which allows one to freely adjust the oscillation frequency with a simple construction and is practically free from the fear of deterioration of the reliability of its semicondutor active element chip. These advangages are derived from the unique construction wherein only a limited portion of the oscillator where the chip is loaded is hermetically sealed, while a dielectric resonator is electromagnetically coupled with the chip by way of a substrate which forms part of a hermetic sealing structure.

Various modifications will become possible for those skilled in the art after receiving the teachings of the present disclosure without departing from the scope thereof.

What is claimed is:

1. A microwave oscillator using a semiconductor active element chip for oscillation having a dielectric resonator electromagnetically coupled thereto to stabilize oscillation, said microwave oscillator comprising:

a housing having an internal space defined by a plurality of walls;

a dielectric substrate mounted within said housing and cooperating with predetermined ones of the walls of the housing to divide said internal space into first and second compartments, said first compartments being air tight;

the semiconductor active element chip mounted on said dielectric substrate within said first compartment and the dielectric resonator mounted on said dielectric substrate within the second compartment;

means for electromagnetically coupling said dielectric resonator to said semiconductor active element chip, and oscillation frequency adjusting means arranged in the second compartment in an adjustable positional relationship to the dielectric resonator for adjusting the oscillation frequency.

2. A microwave oscillator as claimed in claim 1, in which said predetermined walls of the housing are side walls.

3. A microwave oscillator as claimed in claim 2, in which the side walls partly protrude into the internal space to form a continuous shoulder in cooperation.

4. A microwave oscillator as claimed in claim 3, in which the dielectric substrate is laid on and connected to said continuous shoulder to hold said one compartment of the housing air-tight.

5. A microwave oscillator as claimed in claim 1, in which the oscillation frequency adjusting means comprises a threaded hole formed through one of the walls of the housing which corresponds in position to the dielectric resonator, and a screw engaged in said threaded hole of said one wall of the housing, whereby said screw is rotatable to vary a distance between the screw and the dielectric resonator and, thereby, the oscillation frequency.

6. A microwave oscillator as claimed in claim 5, in which the housing and the screw are made of metal.

7. A microwave oscillator as claimed in claim 1, further comprising a conductor mounted on the dielectric substrate within said first compartment and connected to ground.

8. A microwave oscillator as claimed in claim 1, wherein said electromagnetic coupling means is a stripline.

* * * * *

UNITED STATES PATENT AND TRADEMARK OFFICE
CERTIFICATE OF CORRECTION

PATENT NO. : 4,609,883

DATED : September 2, 1986

INVENTOR(S) : Motoo Mizumura and Kenzo Wada

It is certified that error appears in the above-identified patent and that said Letters Patent is hereby corrected as shown below:

```
Column 1, line 23, change "seraling" to --sealing--.
Column 2, line 19, change "theother" to --the other--.
Column 3, line 14, change "chp" to --chip--.
Column 3, line 38, change "embdiment" to --embodiment--.
Column 4, line 4, after "further" insert --,--.
Column 4, line 6, change "a" to --A--.
Column 4, line 26, delete "while" and insert therefor --which--.
Column 6, line 7, change "through" to --throughout--.
```

Signed and Sealed this

Tenth Day of February, 1987

Attest:

DONALD J. QUIGG

Attesting Officer

Commissioner of Patents and Trademarks